United States Patent
Li

(10) Patent No.: US 7,007,258 B2
(45) Date of Patent: Feb. 28, 2006

(54) METHOD, APPARATUS, AND COMPUTER PROGRAM PRODUCT FOR GENERATION OF A VIA ARRAY WITHIN A FILL AREA OF A DESIGN LAYOUT

(75) Inventor: Mu-Jing Li, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 94 days.

(21) Appl. No.: 10/461,041

(22) Filed: Jun. 13, 2003

(65) Prior Publication Data

US 2004/0255258 A1  Dec. 16, 2004

(51) Int. Cl.
G06F 17/50  (2006.01)

(52) U.S. Cl. .................... 716/9; 716/1; 716/2

(58) Field of Classification Search ............ 716/11–15, 716/2, 1, 9; 438/8
See application file for complete search history.

(56) References Cited

U.S. PATENT DOCUMENTS

| | | | |
|---|---|---|---|
| 5,620,916 A | 4/1997 | Eden et al. | |
| 5,689,435 A | 11/1997 | Umney et al. | |
| 5,706,295 A | 1/1998 | Suzuki | |
| 5,798,937 A | 8/1998 | Bracha et al. | |
| 5,926,723 A | 7/1999 | Wang | |
| 5,970,238 A | 10/1999 | Shibata et al. | |
| 5,984,510 A * | 11/1999 | Guruswamy et al. | 716/2 |
| 6,011,911 A | 1/2000 | Ho et al. | |
| 6,026,224 A | 2/2000 | Darden et al. | |
| 6,063,132 A | 5/2000 | DeCamp et al. | |
| 6,078,737 A | 6/2000 | Suzuki | |
| 6,189,136 B1 | 2/2001 | Bothra | |
| 6,209,123 B1 | 3/2001 | Maziasz et al. | |
| 6,275,971 B1 | 8/2001 | Levy et al. | |
| 6,301,686 B1 | 10/2001 | Kikuchi et al. | |
| 6,324,673 B1 | 11/2001 | Luo et al. | |
| 6,370,679 B1 | 4/2002 | Chang et al. | |
| 6,374,395 B1 | 4/2002 | Wang | |
| 6,378,110 B1 | 4/2002 | Ho | |
| 6,446,873 B1 | 9/2002 | Geryk | |
| 6,457,163 B1 | 9/2002 | Yang | |
| 6,461,877 B1 | 10/2002 | Holloway et al. | |
| 6,484,302 B1 | 11/2002 | Freymuth | |
| 6,487,706 B1 | 11/2002 | Barkley et al. | |

(Continued)

OTHER PUBLICATIONS

Yu Chen et al., "Hierarchical Dummy Fill for Process Uniformity," Proc. Asia and South Pacific Design Automation Conf, Jan. 2001, pp. 139-144.

(Continued)

*Primary Examiner*—Thuan Do
(74) *Attorney, Agent, or Firm*—Zagorin O'Brien Graham LLP

(57) ABSTRACT

A technique for generating via array is presented. An origin is set in one corner of a bounding box, and the bounding box is filled, according to at least one spacing rule, starting from the origin, with one or more vias. The bounding box can be defined using a width and a length wherein the bounding box is at least co-extensive with an area for via filling. The bounding box can be larger than the area to be filled, for example, to allow for a metal enclosure or to allow for a non-rectangular area such as a polygon to be filled. When the area to be filled is a polygon, a bounding box of the polygon is filled with vias, any vias outside the polygon can be removed, and any vias crossing a polygon edge can be resized or removed.

39 Claims, 10 Drawing Sheets

U.S. PATENT DOCUMENTS

| | | |
|---|---|---|
| 6,536,023 B1 | 3/2003 | Mohan et al. |
| 6,606,735 B1 | 8/2003 | Richardson et al. |
| 6,611,946 B1 | 8/2003 | Richardson et al. |
| 6,615,400 B1 | 9/2003 | Lukanc |
| 6,637,013 B1 | 10/2003 | Li |
| 6,691,296 B1 * | 2/2004 | Nakayama et al. ............ 716/15 |
| 6,718,527 B1 | 4/2004 | Li |
| 2002/0127479 A1 | 9/2002 | Pierrat |
| 2002/0174413 A1 | 11/2002 | Tanaka |
| 2003/0061583 A1 | 3/2003 | Malhotra |
| 2003/0088843 A1 | 5/2003 | Mehrotra et al. |
| 2003/0182644 A1 | 9/2003 | Li et al. |
| 2003/0196180 A1 | 10/2003 | Li et al. |
| 2003/0228714 A1 * | 12/2003 | Smith et al. ................... 438/8 |
| 2003/0229860 A1 | 12/2003 | Li |
| 2003/0229862 A1 | 12/2003 | Li et al. |
| 2004/0019862 A1 | 1/2004 | Li et al. |
| 2004/0019866 A1 | 1/2004 | Li |
| 2004/0019867 A1 | 1/2004 | Li |
| 2004/0019868 A1 | 1/2004 | Li |
| 2004/0025125 A1 | 2/2004 | Li |
| 2004/0063228 A1 | 4/2004 | Li et al. |
| 2004/0064795 A1 | 4/2004 | Li et al. |
| 2004/0064796 A1 | 4/2004 | Li |
| 2004/0064797 A1 | 4/2004 | Li |

OTHER PUBLICATIONS

Andrew B. Kahng et al., "Filling Algorithms and Analyses for Layout Density Control," IEEE Trans. Computer Aided Design 18(4) (1999) pp. 445-462.

Barnes, "SKILL: A CAD System Extension Language," 1990 27$^{th}$ ACM/EEE Design Automation Conference, pp. 266-271.

Karam et al., "High Level CAD Melds Microsystems with Foundries," 1996 European Design and Test Conference, pp. 442-447.

Luo et al., "An Edge-Endpoint-Based Configurable Hardware Architecture for VLSI CAD Layout Design Rule Checking," 1999 7$^{th}$ Annual IEEE Symposium on Field-Programmable Custom Computing Machines, pp. 158-167.

Diva Verification, http://www.cadence.com/datasheets/diva.html 2002 Cadence Design Systems, Inc., downloaded May 17, 2002, 3 pages.

* cited by examiner width = x   length = y width = x   length = y

New area via array with rectangular via and square via in one array. Spacing among different shapes and edges are different, origin is set at the lower left corner of the lower left via shape.

Area square via array with the neighbor rule reinforced. Any square via can only have certain amount of vias within the minimum spacing range.

Area via is a mixture of square and rectangular via with the neighbor rule reinforced. Any square via or rectangular via can only have certain amount of vias within the minimum spacing

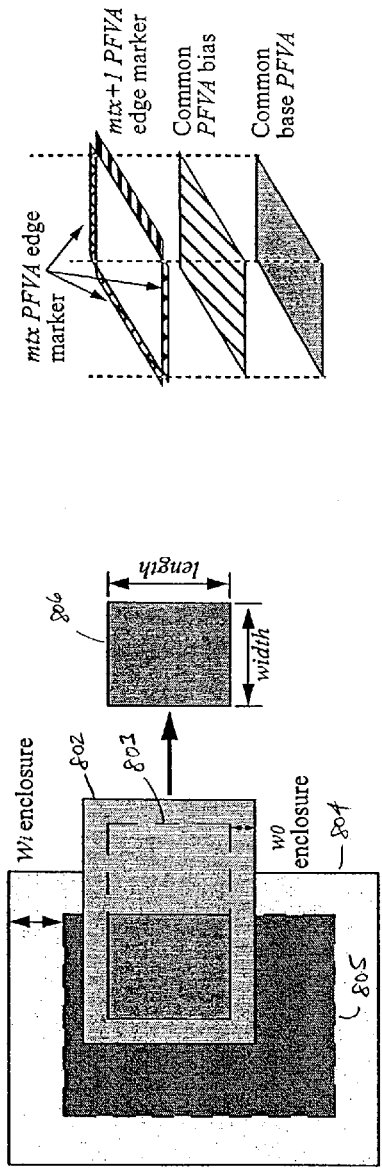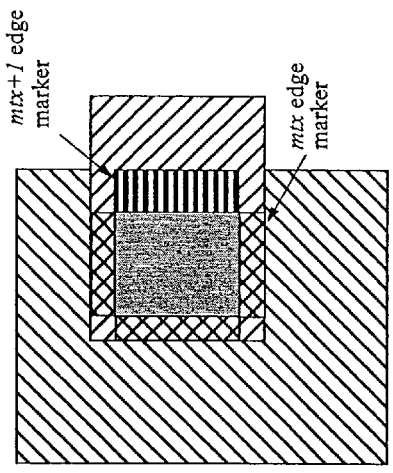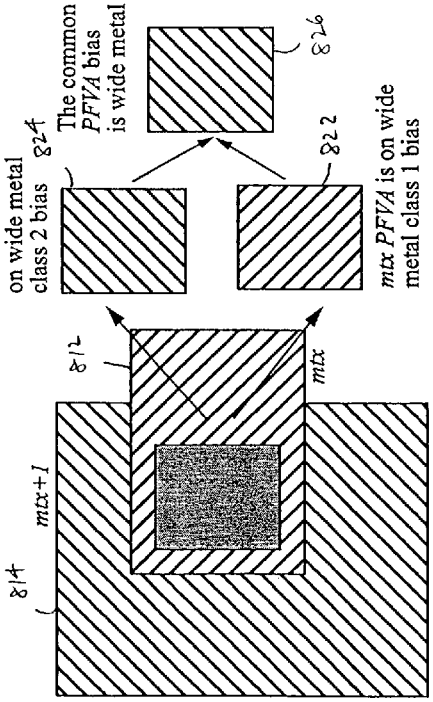
FIGS. 8A–8F

METHOD, APPARATUS, AND COMPUTER PROGRAM PRODUCT FOR GENERATION OF A VIA ARRAY WITHIN A FILL AREA OF A DESIGN LAYOUT

CROSS-REFERENCE TO RELATED APPLICATION(S)

BACKGROUND

1. Field of the Invention

This invention relates to the layout of electronic circuits and more particularly to complex computer aided design layout and placement of vias and via arrays in a design layout of, for example, an integrated circuit (IC) device or printed wiring board (PWB).

2. Description of the Related Art

Design of an electronic circuit, for example, an integrated circuit (IC), is a complicated and time consuming process. FIG. 1 illustrates a typical design flow 100 of an integrated circuit device from conception through the generation of a fabrication ready design layout. Generally, design flow 100 commences with defining the design specifications or requirements, such as required functionality and timing, step 102. The requirements of the design are implemented, for example, as a net-list or electronic circuit description, step 104. The implementation can be performed by, for example, schematic capture (drawing the design with a computer aided design tool) or more typically, utilizing a high level description language such as VHDL, Verilog and the like. The implemented design is simulated to verify design accuracy, step 106. Design implementation and simulation are iterative processes. For example, errors found by simulation are corrected by design implementation and re-simulated.

Once the design is verified for accuracy with simulation, a design layout of the design is created, step 108. The design layout describes the detailed design geometries and the relative positioning of each design layer to be used in actual fabrication. The design layout is very tightly linked to overall circuit performance (area, speed and power dissipation) because the physical structure defined by the design layout determines, for example, the transconductances of the transistors, the parasitic capacitances and resistances, and the silicon area which is used to realize a certain function. The detailed design layout requires a very intensive and time-consuming design effort and is typically performed utilizing specialized computer aided design (CAD) or Electronic Design Automation (EDA) tools.

The design layout is checked against a set of design rules in a design rule check (DRC), step 110. The created design layout must conform to a complex set of design rules in order, for example, to ensure a lower probability of fabrication defects. The design rules specify, for example, how far apart various layers must be, or how large or small various aspects of the layout must be for successful fabrication, given the tolerances and other limitations of the fabrication process. A design rule can be, for example, a minimum spacing amount between geometries and is typically closely associated to the technology, fabrication process and design characteristics. For example, different minimum spacing amounts between geometries can be specified for different sizes of geometries. DRC is a time-consuming iterative process that often requires manual manipulation and interaction by the designer. The designer performs design layout and DRC iteratively, reshaping and moving design geometries to correct all layout errors and achieve a DRC clean (violation free) design.

Circuit extraction is performed after the design layout is completed and error free, step 112. The extracted circuit identifies individual transistors and interconnections, for example, on various layers, as well as the parasitic resistances and capacitances present between the layers. A layout versus schematic check (LVS) is performed, step 114, where the extracted net-list is compared to the design implementation created in step 104. LVS ensures that the design layout is a correct realization of the intended circuit topology. Any errors such as unintended connections between transistors, or missing connections/devices, etc. must be corrected in the design layout before proceeding to post-layout simulation, step 116. The post-layout simulation is performed using the extracted net-list which provides a clear assessment of the circuit speed, the influence of circuit parasitics (such as parasitic capacitances and resistances), and any glitches that can occur due to signal delay mismatches. Once post-layout simulation is complete and all errors found by DRC are corrected, the design is ready for fabrication and is sent to a fabrication facility.

As electronic circuit densities increase and technology advances, for example, in deep sub-micron circuits, skilled designers attempt to maximize the utilization of the design layout and the manufacturability and reliability of the circuit. A via is used to connect, for example, two design geometries, one on each of two consecutive conductive layers (e.g., a metal line on each of two consecutive metal layers) of an electronic circuit. Designers often add additional vias or via arrays to improve circuit reliability, but such activities are frequently tedious and time consuming.

SUMMARY

Present methods of placement for vias and via arrays do not provide for ease of placement for multiple via types, scalability of design and via spacing parameters, or special via placement rules and conditions. Accordingly, an automatable technique for generation of via arrays is presented which provides for ease of placement for multiple via types, scalability of design and via spacing parameters, and special via placement rules and conditions. The automated design layout of an electronic circuit, whether embodied as a design encoding or as a fabricated electronic circuit, is simplified.

In some embodiments, an origin is set in one corner of a bounding box placed around an area to be filled, and the bounding box is filled, according to at least one spacing rule, starting from the origin, with one or more vias. The bounding box may be defined using a width and a length wherein the bounding box is at least co-extensive with an area for via filling. In some embodiments, multiple via types can be filled.

In some embodiments, spacing rules can include neighbor spacing rules, wherein a spacing between vias varies according to a number of neighboring vias and a type of neighboring vias. In some embodiments, the via filling can be according to a redundant via bias rule such that at least one via is placed close to a real edge of a geometry.

In some embodiments, the bounding box can be larger than the area to be filled, for example, to allow for a metal enclosure or to allow for a non-rectangular area such as a polygon to be filled. When the area to be filled is a polygon, a bounding box of the polygon may be filled with vias, and any vias falling outside the polygon may be removed, and any vias crossing a polygon edge may be resized or removed.

In some embodiments, the via filling process can be repeated multiple times, shifting the origin each time, to find an optimum via filling arrangement for a particular area to be filled.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIGS. 8A–8F illustrate an exemplary pure fill via area (PFVA) extraction method according to an embodiment of the present invention.

The use of the same reference symbols in different drawings indicates similar or identical items.

DESCRIPTION OF THE PREFERRED EMBODIMENT(S)

Figure 1:
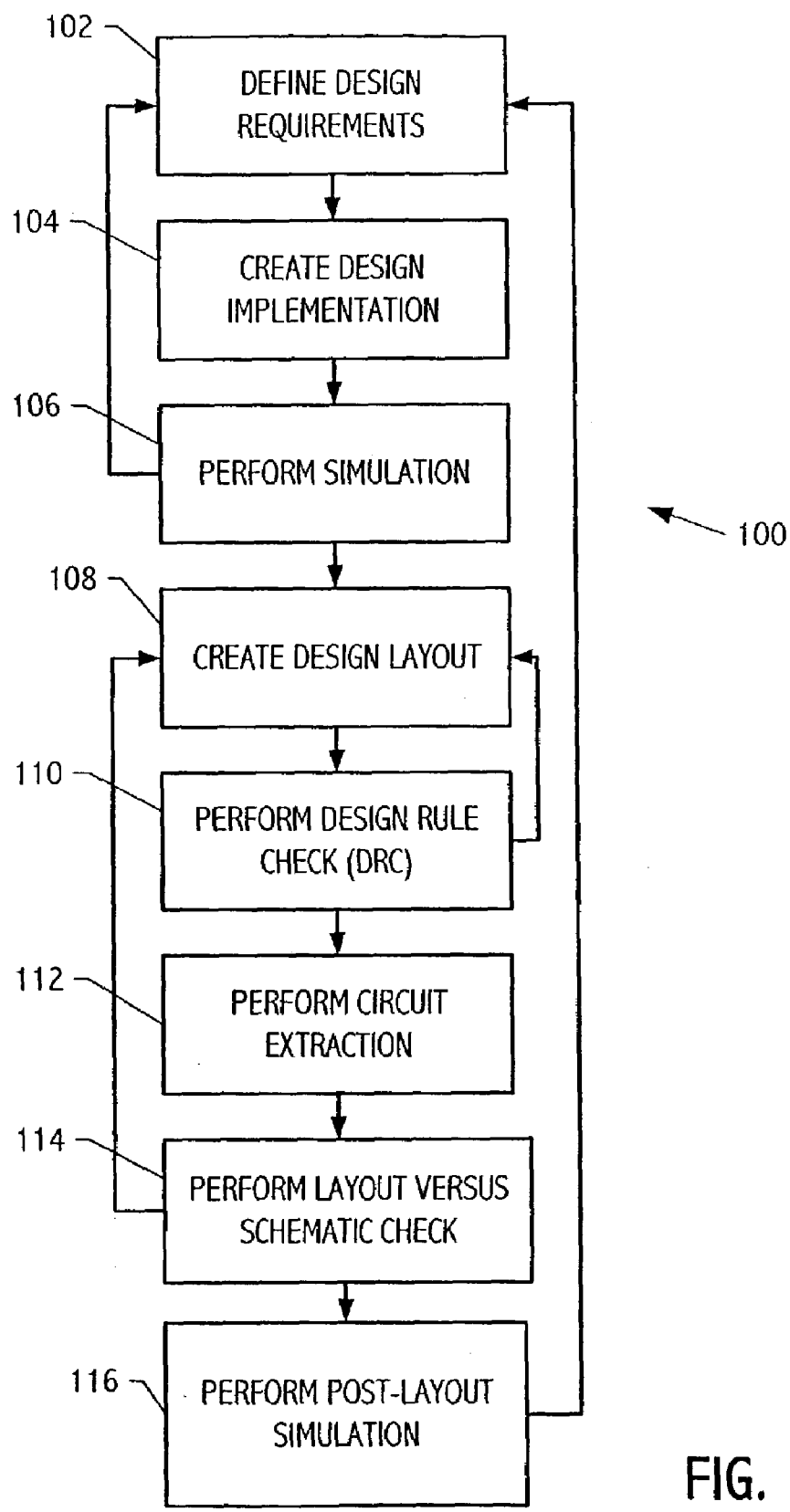
FIG. 1, prior art, illustrates an exemplary design flow 100 for an integrated circuit device.
Figure 2A:
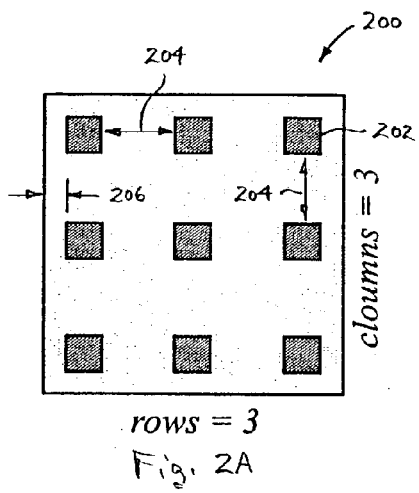
FIGS. 2A–2C illustrate traditional via array implementations and the effect of parameter changes.

FIG. 2A illustrates a traditional via array implementation. Note that traditional arrays typically utilize square vias 202 with a single minimum spacing rule 204 between vias and a single metal enclosure rule 206 for each metal layer. Note that vias can also be referred to as "cuts" in a dielectric layer. A via array of this type is typically implemented as a programmable cell (PCell). A PCell is also referred to as a parameterized cell because the PCell can receive one or more input parameters. For example, a PCell to generate via array 200 can have a row parameter and a column parameter that specify the number of rows and the number of columns of vias in the array. The PCell to generate via array 200 determines the center of the area to be filled, and evenly spaces vias throughout the area. For example, the PCell can manipulate the width and length of the area to be filled to place the rows and columns of vias in an array centered in the area to be filled. The origin of the via array is thus the center of the area to be filled. Other PCells may allow the origin of the array to be, for example, the center of one of the four corner vias, but similarly uses the row and column concept to build the via array. Restrictions are placed on the design rules such that the via width and spacing are even multiples of a design grid to avoid off-grid conditions and ensure that the placement of vias is uniform.

With the advent of deep sub-micron design technology, design rules for via implementations have changed dramatically. The widths and spacings for many geometries, including vias, are very small. Even if the vertices (or edges) of the area to be filled fall on-grid, the center of the area may fall off-grid, and the via array itself may consequently fall off-grid. Furthermore, even if the computed center of the area falls on-grid, if the via width and via spacing rules are themselves not an even multiple of the design grid, the via array can also fall off-grid (depending on the number of rows and columns of vias in the array). Thus, it cannot always be assured that the vertices of the vias in the array always align with the design grid. Additionally, newer designs utilize vias of varying sizes and shapes, for example, rectangular vias, and can have multiple different spacings according to a number and a type of neighboring vias, thus making the row and column concept and the on-grid origin difficult to achieve using traditional methods. For example, although the rectangular via width is typically equal to the square via width, the rectangular via length is not necessarily a multiple of the square via width and/or the square via spacing.

Further, because a via array is filled in the common or overlapping areas of two geometries with allowance for metal enclosure, the common area to be filled is not necessarily a rectangular area. A rectangle may be defined by the two corners, for example, the coordinates of the lower left vertex and the upper right vertex, while a polygon may be defined as a series of coordinates identifying each vertex of the polygon. Note that typically design geometries are on grid, thus the vertices of the area to be filled are also on grid. When the area is filled by different via shapes with different spacing rules, the concept of filling rows and columns of vias forming a via array with a centered origin is not useful.

Figure 2B:
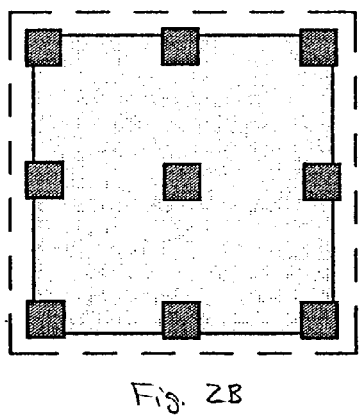
Figure 2C:
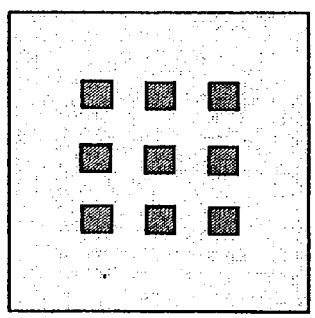

FIGS. 2B–2C illustrate the effect of modifying via spacing rules, for example, to implement a design in a different semiconductor technology, on a traditional 3×3 via array generated by a traditional PCell (i.e., centered in the area to be filled). As illustrated in FIG. 2B, when a via spacing rule is increased, the vias can be shifted outside of the area to be filled, thus causing design rule violations. As illustrated in FIG. 2C, when a via spacing rule is decreased, the area to be filled is not completely filled, resulting in a less reliable circuit design than is possible. Thus, when a circuit is implemented with a traditional PCell utilizing row and column parameters, the via arrays must be regenerated utilizing different input parameters when changing via spacing rules.

According to the present invention, a new technique for generating a via array is presented that allows multiple via types and multiple via spacing requirements to be used. Via array generation is more efficient, allowing for ease of migrating a design to a new technology or for ease of design rule changes during the design process. Thus, a via array with a mixture of different via types having different spacing can be generated automatically. Given an area defined by a length and a width, one corner, for example, the lower left corner, is designated as the origin of the array. Vias are placed in the area, beginning at the origin, fitting as many vias of a first type as will fit in the area allowing for spacing rules. Other via types can be placed in the remaining area, as many as will fit until the area is full or all via types have been attempted. Thus the need to determine the center of the area from a length and a width and the placement of a number of rows and columns of vias is eliminated.

Figure 3A:
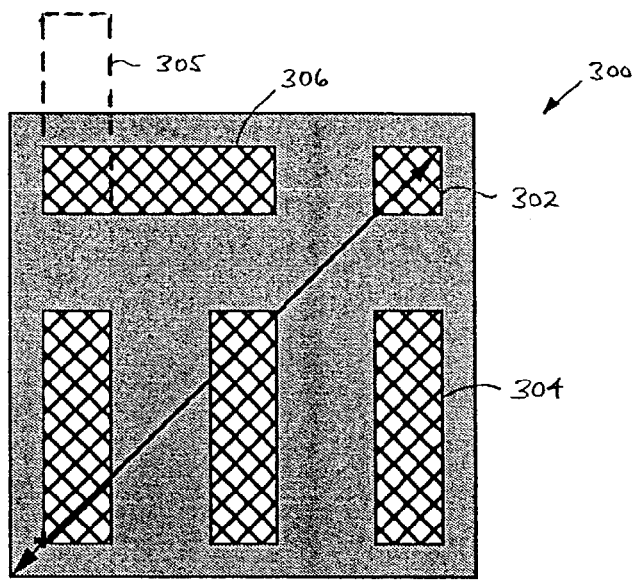
FIGS. 3A–3C illustrate various exemplary via arrays generated according to some embodiments of the present invention.
Figure 3B:
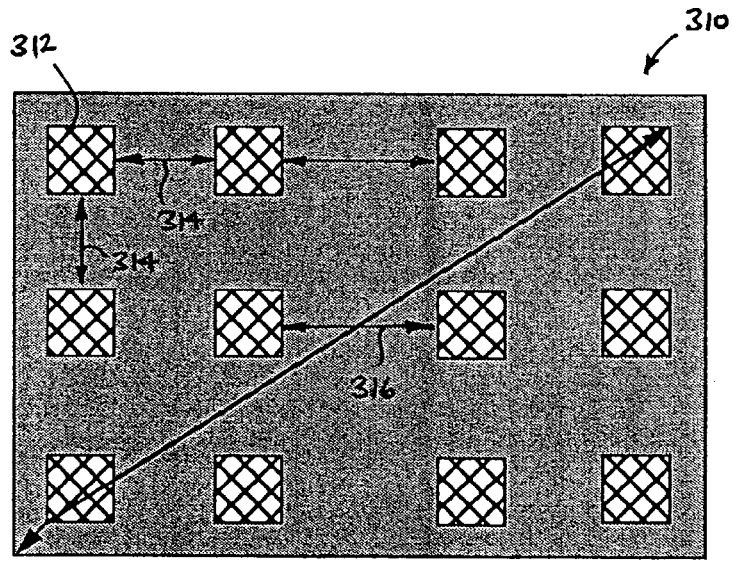
Figure 3C:
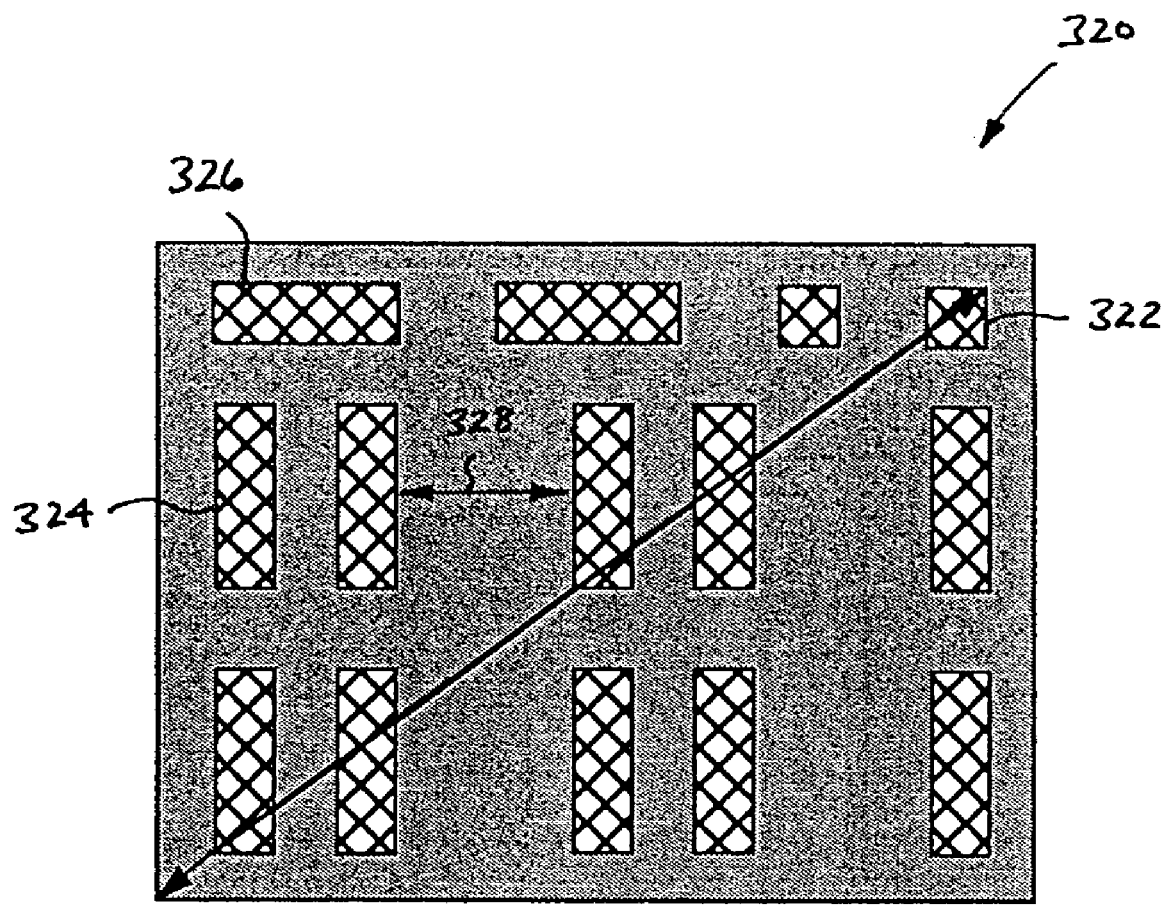

FIGS. 3A–3C illustrate various exemplary via arrays generated according to an embodiment of the present invention. FIG. 3A illustrates a via array 300 having a mixture of square vias 302 and rectangular via types. As illustrated, vertical rectangular vias 304 are placed in the area to be filled, starting from the lower left corner. As many vertical rectangular vias 304 are placed as will fit, allowing for via spacing rules and metal enclosure rules. A via spacing rule defines the minimum amount of space needed between vias for proper lithographic resolution, circuit operation, and reliability. A metal enclosure rule defines the minimum amount of space needed between edges of the geometry and vias for proper circuit operation and reliability. Via spacing rules and metal enclosure rules can vary based on type of via, metal layer, size of geometry, type of technology, and the like. In the array 300, three such vertical vias 304 can fit, as a fourth vertical via (labeled 305) falls partially outside the area. Next, as many horizontal rectangular vias 306 are placed in the remaining area of the area to be filled. In the exemplary array 300, one such horizontal via 306 fits within the area. Next, as many square vias 302 are placed in the remaining area of the area to be filled. In the exemplary array 300, one such square via 302 fits within the area. Although only three via types are illustrated, the present invention can support any number of via sizes and types. Additionally, the ordering of the placement of the differing types of vias can be different than shown.

FIG. 3B illustrates a via array 310 of square vias 312 having neighbor rules enforced. Neighbor rules are special via spacing rules that define minimum via spacing based on the number of neighbor vias. For example, one such neighbor rule may require that any square via can only have a certain number of vias (here, as shown, three vias) within the range of minimum spacing 314, otherwise a larger square via spacing 316 is applied to the extra neighboring vias.

FIG. 3C illustrates another via array 320 generated according to an embodiment of the present invention. Note here that square vias 322 and rectangular vias 324 and 326 can have different spacing requirements and different neighbor rules. Thus, in via array 320, not only are different spacing rules applied to the different via shapes and edges, but also according to the number and type of neighbor vias. As shown, a rectangular via can only have certain number of via shapes in the range of minimum spacing, otherwise a wide rectangular via spacing 328 is applied.

As illustrated in FIGS. 2A–2C, the traditional implementation of PCells does not provide for changes in design rules. Because the traditional implementation of a PCell utilizes row and column parameter inputs, when via spacing rules are increased, the via array can be outside the area to be filled as illustrated in FIG. 2B, and when via spacing rules are decreased, the via coverage is not sufficient as illustrated in FIG. 2C.

Figure 4A:
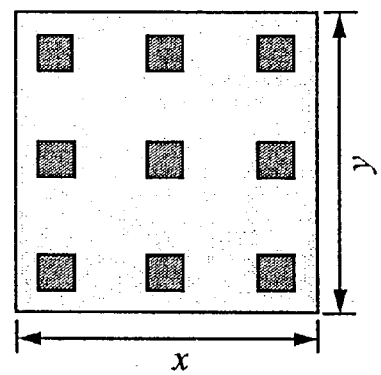
FIGS. 4A–4C illustrate various exemplary via arrays and the effect of parameter changes according to some embodiments of the present invention.
Figure 4B:
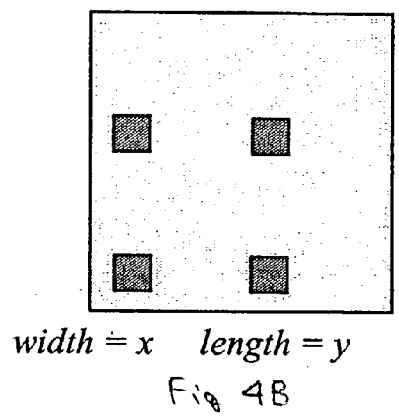
Figure 4C:
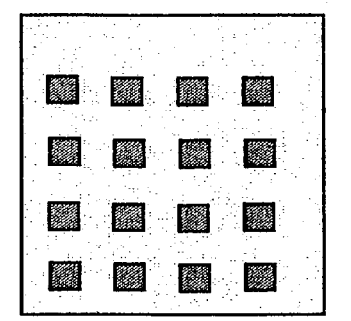

In contrast, as illustrated in FIGS. 4A–4C, a PCell implementation according to the present invention provides for changes in design rules. Because the present implementation of a PCell utilizes a length and width inputs, when via spacing rules are increased, the via array is filled with less vias as illustrated in FIG. 4B, and when via spacing rules are decreased, the via array is filled with more vias as illustrated in FIG. 4C.

PCells are preferably used to generate and define via arrays. Some PCells share a sub-master defining the type of parameter combination. All sub-masters share a super-master, bridging all PCells and the PCell generation program. For example, using the Cadence Opus environment, PCells may be generated in the SKILL® programming language or other programming language understood by computer-aided-design (CAD) tools for the manipulation of design layouts. SKILL is a high level coding language that allows the manipulation of individual objects in a design database. SKILL is a registered trademark of and is available from CADENCE DESIGN SYSTEMS, INC. of San Jose, Calif. A PCell may be configured to receive one or more input parameters, and generates the via shapes and necessary enclosure metal to form a cell. This type of cell can be placed into a design database to form the desired connection (e.g., between two metal features). The use of PCells allows the cell to be driven by the design technology such that the cell itself is design rule independent. Therefore, the cell changes when one or more of the parameters change, which raises productivity. Additionally, the program that creates the PCell can be optimized for efficiency.

According to an embodiment of the present invention, a methodology of filling via arrays has allowances for multiple types of via filling design flows, for example, handling both a sub-cell of a design and the top level design. First, the common areas of the same signal geometries on two consecutive metal layers are found. Next, a via array is filled into the common areas connecting the common areas. The via PCell may be designed for interactive placement by designers and automatic placement by a design flow.

Thus, according to the present invention, although spacing rules and via types are more complicated, the via array generation process is simplified and avoids any possible off grid problem. After locating the origin on grid at one corner of the area to be filled, vias are added on-grid allowing for minimum via spacing according to via width, via spacing rules and neighbor rules which are each defined according to multiples of a design grid size. Thus, the via array is always on grid. To accommodate non-rectangular areas to be filled, a bounding box may be formed around the area, and the coordinates of the bounding box used as the input parameters to a PCell. Such coordinates may be vertices (e.g., any two opposing vertices) or edges to essentially specify the width and length of the bounding box. Such a bounding box is formed preferably at least co-extensive with the area to be filled, although it may be larger in some embodiments.

Figure 5A:
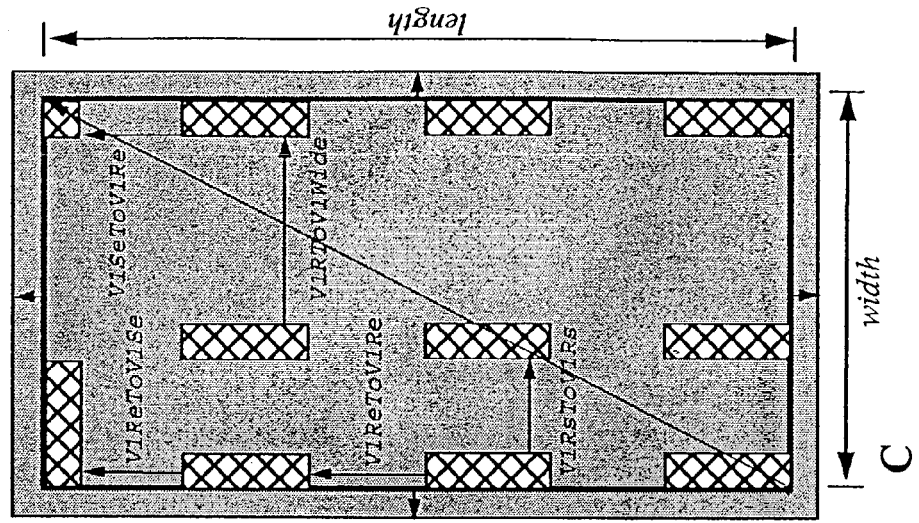
FIGS. 5A–5C illustrate exemplary via arrays and various design parameters according to some embodiments of the present invention.

FIG. 5A illustrates exemplary spacing rules for a particular via layer. The following exemplary list of design rules can be used to implement a PCell. Here, the following width and spacing rules are for a via "V1," which is used to connect metal layer "M1" to metal layer "M2."

| PARAMETER | SPACING DEFINITION |
|---|---|
| V1Width | Width of via |
| V1RLength | Length of rectangular via |
| V1ToV1 | Spacing between square vias |
| V1SeToV1Re | Spacing between via square end to via rectangle end |
| V1SsToV1Rs | Spacing between via square side to via rectangle side |

-continued

| PARAMETER | SPACING DEFINITION |
|---|---|
| V1ReToV1Re | Spacing between via rectangle end to via rectangle end |
| V1RsToV1Rs | Spacing between via rectangle side to via rectangle side |
| V1RsToV1Re | Spacing between via rectangle side to via rectangle end |
| V1SToV1Wide | Square spacing for more than two adjacent vias |
| V1RToV1Wide | Rectangle spacing for more than three adjacent vias |

In addition to different spacing and width rules depending on the type of via and the number of neighboring vias, in a deep sub-micron design technology, conductive layer objects may be decomposed into one or more wide class objects, and a different set of design rules applied for each wide class object. For example, when a via is placed in a wide metal area, it may need more metal enclosure than that of a via which is placed in a narrower metal area. When a via is partially in wide metal area and partially in non-wide metal area, it may need different metal enclosure in each different area. In general, as the design technology advances, more and more wide classes of metal features may be used in a design layout, having different metal enclosure design rules for each wide metal class. Additional details of exemplary methods of deriving wide class objects are described in "Structure and Method for Separating Geometries in a Dsign Layout into Multi-Wide Object Classes" by Mu-Jing Li, et al., U.S. patent application Ser. No. 10/260,813 filed on Sep. 30, 2002, which application is hereby incorporated by reference in its entirety. Because the wide metal enclosure amount can vary from class to class, a PCell according to an embodiment of the present invention preferably provides only the minimum metal enclosure capability, and calculation of the appropriate wide metal enclosure is taken into account in the determination of the area to be filled.

Figure 5B:
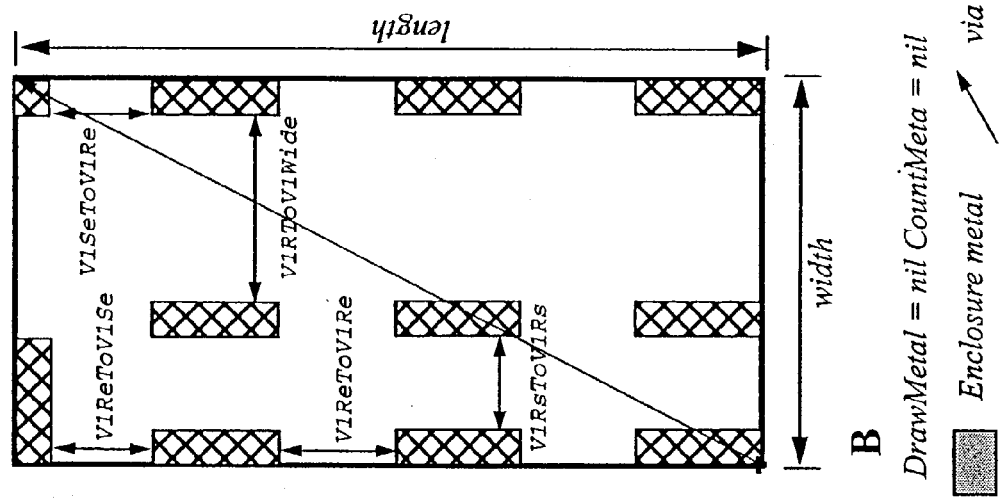
Figure 5C:
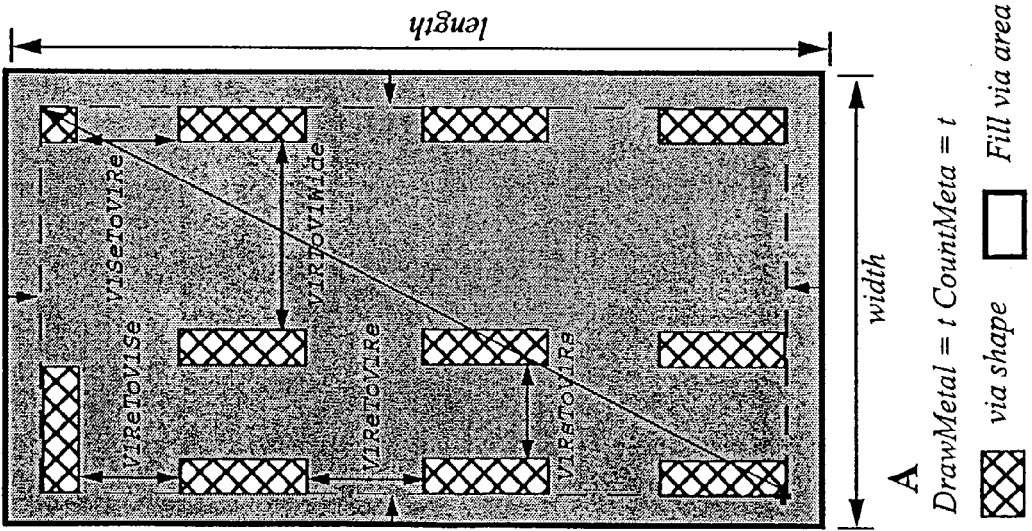

FIGS. 5A and 5B illustrate two exemplary options for input to a PCell according to an embodiment of the present invention. As shown in FIG. 5A, a length and width specify an area to be filled that includes area reserved for metal enclosure. Prior to filling, the area is shrunk by the appropriate metal enclosure rule. As shown in FIG. 5B, a length and a width specify an area to be filled, for example, a Pure Fill Via Area as described in "Pure Fill Via Area Extraction in a Multi-Wide Object Class Design Layout" by Mu-Jing Li, U.S. patent application Ser. No. 10/260,816 filed on Sep. 30, 2002, which application is hereby incorporated by reference in its entirety. These two exemplary options can be indicated, for example, by a 'count_metal' input parameter to a PCell. A 'draw_metal' input parameter may also be utilized to indicate that a metal feature enclosing the via array is to be drawn after filling the area with vias, as illustrated in FIG. 5C.

Figure 6:
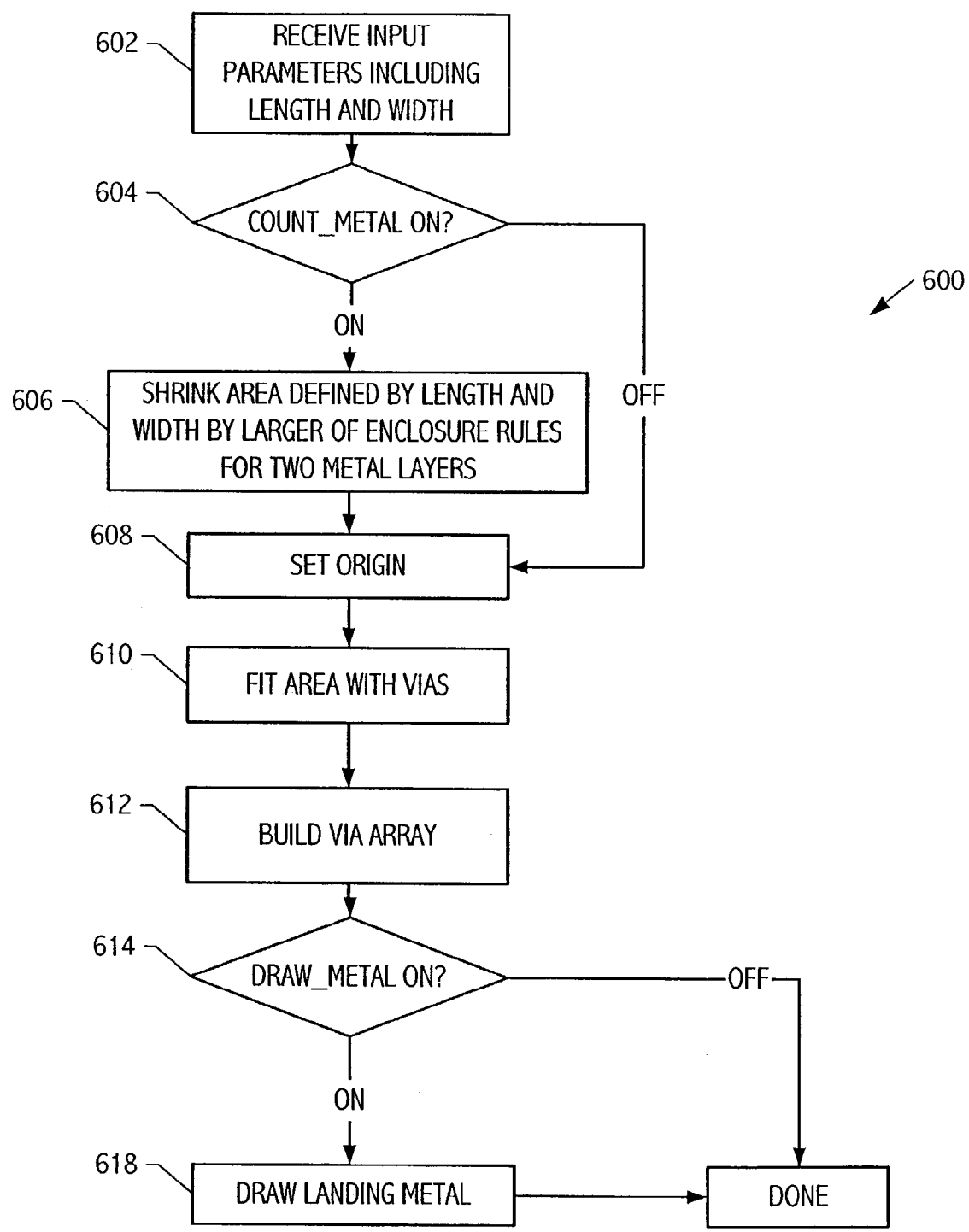
FIG. 6 illustrates an exemplary design flow of via array generation according to an embodiment of the present invention.

FIG. 6 illustrates an exemplary design flow of via array generation by a PCell according to an embodiment of the present invention. Input parameters, including a length and a width to define an area, count_metal, and draw_metal, are received, step 602. The via array to be generated by the PCell will always fit in the area, even if design rules are changed, i.e., either increased or decreased. Note that the length and width define a bounding box co-extensive with the actual area to be filled with vias (as described in greater detail herebelow), thus accommodating, for example, a polygon area or an area including metal enclosure.

The count_metal parameter is evaluated, step 604. If count_metal is on, the area defined by the length and the width is shrunk by the larger of the respective metal enclosure rules of the two related metal layers to form the area to be filled, step 606. If count_metal is off, the area defined by the length and the width is the actual area to be filled. An origin is defined to be one corner, for example, the lower left corner, of the area to be filled, step 608. The length and width of the area to be filled are used to fit vias into the area, step 610. Via types can include horizontal rectangular, vertical rectangular, square and the like. For example, the length is used to determine whether and how many vertical rectangular vias will fit in the area. Any remaining area can be fit with horizontal rectangular vias. Further remaining area can be fit with square vias. The via fitting preferably accounts for via spacing and neighbor rules. The required via spacing can vary based on technology, and may include several different rules (e.g., rectangular via side to rectangular via side, rectangular via end to rectangular via side, rectangular via end to rectangular via end; rectangular via side to square via; etc.) as well as additional rules to accommodate neighboring via rules and isolated via rules. In certain embodiments, the "minimum" such via spacing rules are preferably used when generating the via array in order to avoid isolated via problems, and the generated via array may be smaller than the area specified by the width and length (e.g., the via array shown in FIG. 4B). Alternatively, certain via spacings may also be increased so that a generated via array is expanded to uniformly fit within the full area. This may be utilized, for example, when a specific type of via need not adhere to an isolated via rule. In such cases the generated via area can be as large as the full area specified by the length and width, with one or more of the via spacings being larger than its respective minimum spacing. Neighboring via rules may be incorporated into via generation by increasing the spacing between certain rows and columns of vias in the generated array. For example, in the array shown in FIG. 3C, the third rectangular via (relative to the starting origin) in the lower-most row may be placed using the neighboring rule 328 rather than the side-to-side rule otherwise utilized between the first and second via.

Next, the via array is built, step 612, for example, using an "adding" operation so that no calculated coordinate falls off-grid (i.e., no divide operations need be performed). A determination is then made whether the draw_metal parameter is on, step 614. If off, the flow is complete. If the draw_metal parameter is on, the landing metal and covering metal is drawn, step 618, and the flow is complete.

The draw_metal and count_metal options provide flexibility and allow a PCell implementation to accommodate multiple conditions. The draw_metal option allows a designer to choose whether to generate enclosure metal to meet a minimum metal enclosure rule, for example, when a PCell is manually placed into the design, either to align to an existing design, or when a design has not yet been generated. A designer can also choose not to generate the enclosure metal and to not count metal, for example, when the area to be filled is a Pure Fill Via Area (PFVA), whether manual or automatic generation of via arrays is utilized (i.e., because the metal features on both layers are already present, and the required via enclosure rules for each layer already accounted for). By not generating the enclosure metal, the PCell generation process can be completed more quickly and the data base size can be smaller.

The count_metal option allows a designer to choose whether to start generating a via array directly from the corner of the area, or leave allowance for a minimum metal enclosure and to start generating the via array from a position inside the corner.

Figure 7:
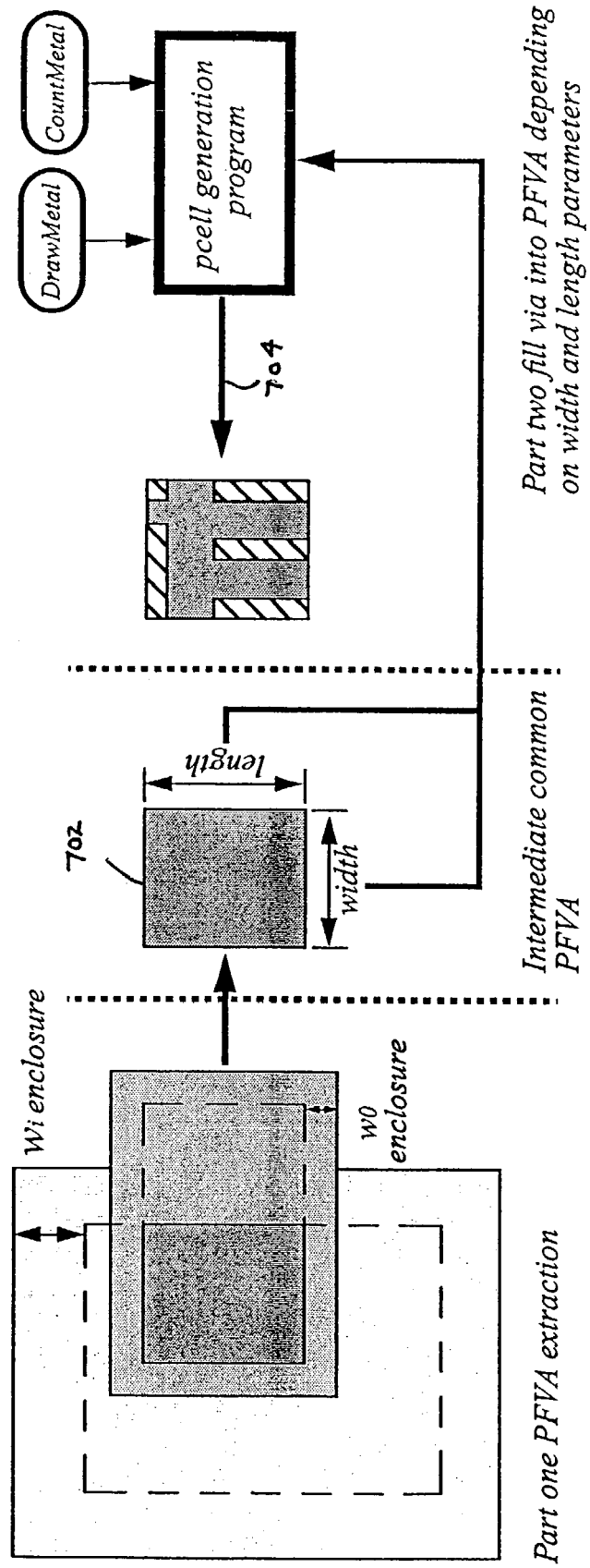
FIG. 7 illustrates a method to fill a via array in a connection area according to an embodiment of the present invention.

FIG. 7 illustrates a method to fill a via array in a connection area according to an embodiment of the present invention. As illustrated, the extraction of the common area 702 is separate from the filling of the via array, illustrated as 704. Deep sub-micron designs contain multi-wide class objects and multi-wide metal enclosure rules. For example, multi-wide class metal can have redundant via design rules and also can have via neighboring rules and other possible design rules. A redundant via design rule check requires that for a metal piece (or region of a piece) which is both greater than a certain width and greater than a certain area in size, any connection area within it (i.e., an area having at least one via connecting it to another metal layer) should contain at least a certain number of vias, some of which should be close to the landing metal edge or close to each other. The redundant via design rule may apply differently on different classes of objects which are defined by both minimum width and minimum area. Such a redundant via test can be waived for any connection area having at least a certain minimum number of vias there within. Additional details of methods for checking redundant via rules are described in "Redundant Via Rule Check in a Multi-Wide Object Class Design Layout" by Mu-Jing Li, et al., U.S. patent application Ser. No. 10/260,817 filed on Sep. 30, 2002, which application is hereby incorporated by reference in its entirety.

It may be advantageous to account for the wide metal enclosure rules when defining the common areas of the same signal geometries on two consecutive layers. By extracting the common area in this way, the procedure to fill the via array can be simplified. Additionally, the redundant via rule is preferably accounted for during the definition of the common areas, as described further herebelow.

Thus design data size and run-time is reduced. In addition, the tool used to extract the area can be different from the tool used to fill the area. The tool used to extract the area can include wide metal property manipulation, real metal edge detection, and the like, while the tool used to fill the via array can be much simpler.

FIGS. 8A–8F illustrate an exemplary common fill via area extraction method according to an embodiment of the present invention. To reduce uncertainty, fill via areas are extracted with metal characteristics being taken into account. Fill via areas are found for each of two consecutive conductive layers. For example, geometries can be shrunk, as illustrated in FIG. 8A by the proper metal enclosure rule, resulting in the fill via area for each metal layer related to the vias. Note that the metal enclosure rule can be different for different sized geometries because of wide class rules. For example, geometry 802 may be a wide class w0 object, and require a corresponding enclosure which results in a layer pure fill via area 803, whereas geometry 804 may be a wide class wi object, and require an corresponding enclosure which results in a layer pure fill via area 805. The common base PFVA 806 is then determined, as shown in FIG. 8B, which is the intersection of the two layer PFVAs 803, 805.

The base PFVA is then used to determine which redundant via wide class rule should be applied for each of the two metal layers. The geometry 802 may be assumed to correspond to a redundant via wide class 1 object 812. Since the base PFVA 806 falls within this wide class 1 object 812, the base PFVA 806 is determined to have a redundant via wide class 1 bias on the mtx layer, represented by feature 822. This feature 822 may be derived onto a different layer, or the base PFVA 806 tagged with an appropriate attribute, or by some other suitable technique. If the geometry 802 contains more than one wide object class, and more than one such wide object class overlaps the base PFVA 806, the resulting bias for the mtx layer is preferably the highest wide object class which overlaps the base PFVA 806. Similarly, the geometry 804 may be assumed to correspond to a redundant via wide class 2 object 814. Since the base PFVA 806 falls within this wide class 2 object 814, the base PFVA 806 is determined to have a redundant via wide class 2 bias on the mtx+1 layer, represented by feature 824. Such a feature 824 may be viewed as a mtx+1 layer redundant via bias fill via area.

The resulting bias of the base PFVA 806, represented as feature 826, is determined by the highest wide class of either the mtx layer of the mtx+1 layer, as illustrated in FIG. 8D. If a fill via area is overlapping with multiple redundant via wide metal class objects, the fill via area is derived at the highest redundant via wide metal class bias. As illustrated in FIGS. 8B and 8D, the fill via areas of each layer may be combined to form the common fill via areas. The common fill via areas of the two consecutive metal layers may be derived into a construction layer as a base fill via area as illustrated in FIG. 8B. The redundant via bias of the base fill via areas of both layers may be combined and derived into different redundant via bias construction layers depending on which redundant via wide metal class they belong to, as illustrated in FIG. 8D. The highest redundant via bias is preferably then used as the common bias. For example, for a specific base fill via area, if the fill via area is not marked for one layer, but is marked as redundant via wide metal class 2 for another layer, the common fill via area redundant via bias marker is derived on the redundant via wide metal class 2.

For those fill via areas which contain redundant via biases, the edges which are close to the real metal edges within the range specified by the redundant via design rule on each metal layer are preferably marked with edge markers. These edge markers may be derived on different construction layers for each metal layer, as illustrated in FIG. 8E. The final PFVA is derived as different construction layers to provide all necessary information to the via fill process, including the base PFVA, the redundant via bias, and the metal edge marker information, as illustrated in FIG. 8F. The edge markers may be used in the via fill process to ensure that redundant via rules that require at least one via to be placed close to a real edge of a geometry are satisfied.

The final derived PFVA provides an area in which a via can be placed without violating any via design rule. Thus, the fill via process can be simplified and only needs to focus on the filling vias in a given area, for example, if it is not a redundant via bias fill via area. If the area is a redundant via bias area, the flow properly accounts for the minimum number of vias that must be filled and to which edge(s) the via array should be close.

Figures 9A, 9B, 9C, 9D, 9E, 9F:
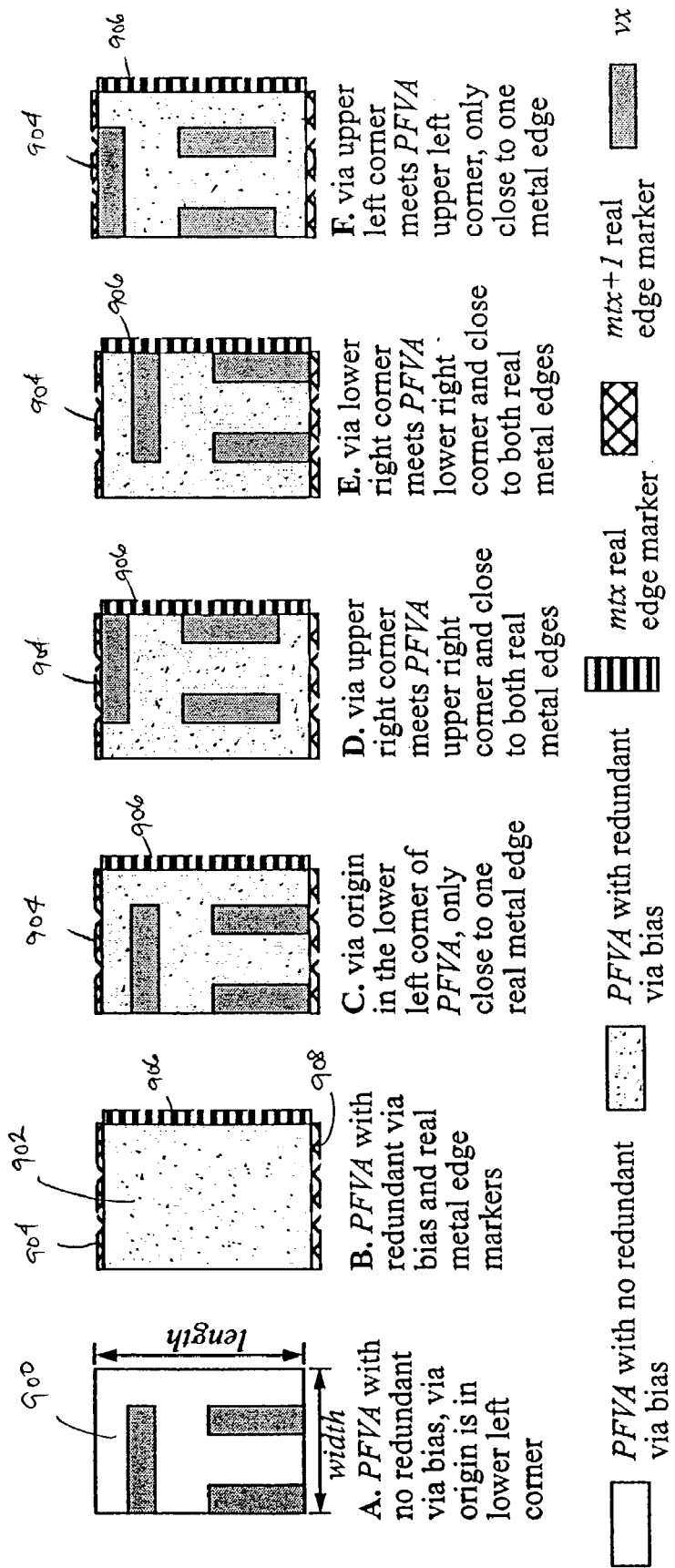
FIGS. 9A–9F illustrate an exemplary placement of a via array into a PFVA according to an embodiment of the present invention.

FIGS. 9A–9F illustrate an exemplary placement of a via array into a rectangular fill via area according to an embodiment of the present invention. As illustrated, a via array can be placed into a common fill via area with the possible redundant via metal edge design rules enforced. FIG. 9A illustrates a rectangular common fill via area 900 having an origin (not shown) of the via array placed in the lower left corner. FIG. 9B illustrates a rectangular fill via area 902 with redundant via bias (i.e., meaning that a redundant via rule must be satisfied) and associated metal edge marker 906 for landing metal (mtx) and metal edge markers 904, 908 for covering metal (mtx+1). FIGS. 9C–9F illustrate exemplary via placements and the use of the bias and edge markers to guide the via filling process utilizing different via placements to attempt to meet redundant via metal edge design rules. In the examples shown, a via array generated using the lower left corner as the origin (e.g., FIG. 9C) is displaced or shifted to abut the upper-right corner (e.g., FIG. 9D), to abut the lower-right corner (e.g., FIG. 9D), or to abut the upper-left corner (e.g., FIG. 9F). Note that the filling arrangement in FIG. 9C does not meet the edge marker test for metal layer mtx (i.e., no via "touches" the real edge marker 906 for layer mtx). The filling arrangement in FIG. 9F also does not meet the edge marker test for metal layer mtx. Conversely, both the generated via arrays in FIG. 9D and FIG. 9E meet the edge marker test for both mtx and mtx+1 (i.e., having at least one via that touches at least one of the edge markers 904, 908 for mtx+1, and having at least one via that touches the edge marker 906 for mtx). In situations where edge markers from both landing and covering metal overlap, a single via can make the array meet the redundant via metal edge rule.

In general, for any fill via array, the fill process begins having an origin at one corner, for example, the lower left corner, of the fill via area. The total area of the valid filled vias, and whether the redundant via design rules are met, are tracked and the origin is shifted and a new via array is filled. The origin can be shifted toward the upper right corner (e.g., the opposite vertex), tracking these items such that an optimal solution can be found. Once the origin has been shifted by an amount equal to the via width and via space, all possibilities have been covered, and no additional iterations are necessary. For a case where each iteration shifts the origin by a distance equal to the design grid, the maximum number of test steps can be computed to be:

MaxStep=((ViaWidth+ViaSpacing)/XYGrid)^2

After filling the fill via area utilizing different origin placements, typically the fill arrangement which has the largest via area and meets the redundant via rules is chosen. The trade off for fill accuracy is the run time. Because the shape of the area to be filled can be complex, and because the accuracy requirements can vary from one flow to another, an algorithm which is a compromise of the accuracy and the run time can be utilized. Any fill via design flow can always combine these two parts to find the best solution for the specific requirement.

FIGS. 10A–10E illustrate an exemplary technique for handling the filling of a via array in a polygon fill area according to an embodiment of the present invention. Generally, a bounding box may be derived (or at least inferred) that is at least co-extensive with the polygon. As a specific example shown in FIG. 10A, a rectangular bounding box 1004 may be generated which circumscribes the polygonal area 1002. Such a bounding box may be "inferred" by using as its lower left coordinate the negative-most x and y coordinate of any polygon vertex, and using as its upper right coordinate the positive-most x and y coordinate of any polygon vertex, and a specific construction layer geometry is not required.

Figures 10A, 10B, 10C, 10D, 10E:
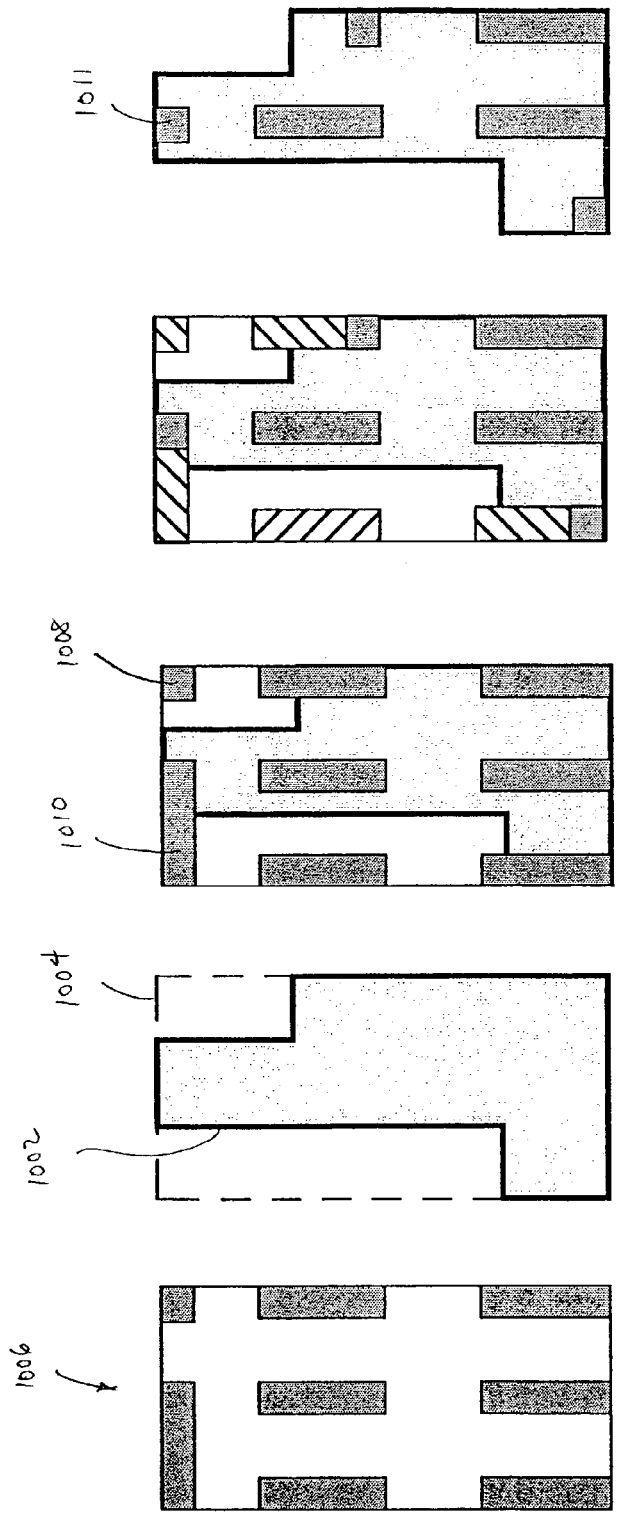
FIGS. 10A–10E illustrate an exemplary technique for handling the filling of a via array in a polygon area according to an embodiment of the present invention.

Then, the bounding box of the polygon area is filled with vias as described above in the context of a rectangular area to be filled, such as the via array 1006 shown in FIG. 10B. Any via outside the polygon area 1002 is deleted (e.g., via 1008) and any via not completely inside the polygon area (e.g., via 1010) is deleted or resized, as shown in FIG. 10D. For example, via 1010 is resized from a rectangular via to a square via 1011 which fits within the polygon 1002, as shown in FIG. 10E. A large via may also be resized to a smaller via type. If the fill via area is a redundant bias area, the remaining vias may be checked to ensure that the vias still meet the corresponding redundant via rules.

The flows and algorithms illustrated herein can be performed on a portion of a design layout, two conductive layers or repeated for multiple conductive layers. These flows and algorithms can be performed throughout the design process and repeated as design changes occur. Moreover, a fill via area may be any of a variety of shapes, including a square, a rectangle, a non-rectangular polygon having rectilinear edges (i.e., so called "Manhattan" layouts), a polygon having arbitrary angled edges, a non-polygon shape, and others. A bounding box may be circumscribed around any of such shapes for use with the via array generation techniques described herein.

The flows and algorithms illustrated herein can be utilized for placement of vias and via arrays according to various embodiments of the invention. It is appreciated that operations discussed herein may include directly entered commands by a computer system user, but some embodiments can include steps executed by software modules. The functionality of steps referred to herein may correspond to the functionality of modules or portions of modules. In addition to software modules, the above flows or portions of flows can be implemented as application instructions or menu items.

The operations referred to herein may be modules or portions of modules (e.g., software, firmware, or hardware modules). For example, the software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into sub-modules to be executed as multiple computer processes. Moreover, alternative embodiments may combine multiple instances of a particular module or sub-module. Furthermore, those skilled in the art will recognize that the operations described in exemplary embodiments are for illustration only. Operations may be combined or the functionality of the operations may be distributed in additional operations in accordance with the invention.

Thus, the flows described herein, the operations thereof and modules therefore may be executed on a computer system configured to execute the operations of the flows and/or may be executed from computer-readable media. The flows may be embodied in a machine-readable and/or computer-readable medium for configuring a computer system to execute the flows. Thus, the software modules may be stored within and/or transmitted to a computer system memory to configure the computer system to perform the functions of the module.

The flows described herein can be applied to an entire design layout or portions thereof. For example, applying a flow to a smaller portion of a design layout can be performed to improve EDA tool performance, or as portions of the design layout are completed, or when only a portion of the design layout needs an increased density, or any other similar reason.

Although the above embodiments have been described in relation to Cadence EDA tools and SKILL language code, the techniques described herein can be applicable to and make use of any EDA tools, electronic circuit layout, and implemented in any code language.

Although the above embodiments have been described in relation to integrated circuit layouts, the techniques described herein can be equally useful in the layout of other electronic devices, for example in a layout of a printed wiring board.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method for generating a via array, said method comprising the steps of:
   setting an origin at a corner of a bounding box associated with an area for via filling; and
   filling the bounding box with a plurality of vias according to at least one spacing rule, starting from the origin.

2. The method, as recited in claim 1, wherein the bounding box is at least co-extensive with the area for via filling.

3. The method, as recited in claim 1, wherein the area for via filling is rectangular, and is identical in size to its associated bounding box.

4. The method, as recited in claim 1, wherein the area for via filling is rectangular, and is identically the same as its associated bounding box.

5. The method, as recited in claim 1, wherein the filling step comprises:
   placing as many of a first type of via as will fit in the bounding box in accordance with the at least one spacing rule; and
   repeating the placing step for additional types of vias, until all types of vias have been attempted or the bounding box is full.

6. The method, as recited in claim 1, wherein the at least one spacing rule includes a neighbor spacing rule defining a minimum spacing between vias according to a number of neighboring vias of a type.

7. The method, as recited in claim 1, wherein the at least one spacing rule includes a via spacing rule defining a minimum spacing between vias according to a type of neighboring via.

8. The method, as recited in claim 1, wherein the at least one spacing rule includes an enclosure rule that provides for a perimeter region into which no vias are filled.

9. The method, as recited in claim 8, wherein the enclosure rule corresponds to a wide object class rule.

10. The method, as recited in claim 1, wherein the filling step is further according to a redundant via bias rule such that at least one via is placed close to a real edge of a geometry.

11. The method, as recited in claim 1, further comprising:
    defining the area for via filling as corresponding to an overlap of a design geometry on a first conductive layer and a design geometry on a second conductive layer.

12. The method, as recited in claim 1, wherein the filling step comprises:
    placing at least one via in proximity to an edge of the bounding box that corresponds to an edge of a design geometry on a first conductive layer; and
    placing at least one via in proximity to an edge of the bounding box that corresponds to an edge of a design geometry on a second conductive layer.

13. The method, as recited in claim 1, wherein the bounding box includes a perimeter region within which vias are not placed.

14. The method, as recited in claim 1, wherein the method further comprises:
    removing any vias of a first type which lie outside of the area for via filing;
    replacing any via of the first type which cross a boundary of the area for via filling, by a via of a second type smaller than the via of the first type; and
    removing any via of the second type which cross a boundary of the area for via filling.

15. The method, as recited in claim 1, wherein the area for via filling comprises a polygon area, and the method further comprises:
    removing any vias filled outside of the polygon area; and
    removing any vias crossing an edge of the polygon area.

16. The method, as recited in claim 1, wherein the area for via filling comprises a polygon area, and the method further comprises:
    removing any vias filled outside of the polygon area; and
    resizing any vias crossing an edge of the polygon area to a smaller type via.

17. The method, as recited in claim 16, wherein the resizing step comprises:
    reducing any rectangular via crossing an edge of the polygon area to a square via, and
    removing any square via that crosses an edge of the polygon area.

18. The method, as recited in claim 1, further comprising:
setting another origin in another corner of the bounding box;
    filling the bounding box according to the at least one spacing rule, starting from the another origin, with one or more vias;
    comparing total via area and rule check results of the fillings and choosing one of the via fillings.

19. The method, as recited in claim 1, wherein the one or more vias include vias having different sizes.

20. The method, as recited in claim 1, wherein the one or more vias comprise at least one of a vertical rectangular via, a horizontal rectangular via, and a square via.

21. The method, as recited in claim 1, wherein the filling is performed during a generation of an electronic layout of an integrated circuit such that a change in a via spacing rule automatically results in a change in a total number of vias filled in the bounding box.

22. An electronic circuit product created using the method of claim 1.

23. A computer program product for generating a via array, the computer program product comprising:
    a set of instructions stored on computer readable media, the set of instructions configured to:
    set an origin in one corner of a bounding box associated with an area for via filling; and
    fill the bounding box with a plurality of vias according to at least one spacing rule, starting from the origin.

24. The computer program product, as recited in claim 23, the set of instructions further configured to:
    define the bounding box to be at least co-extensive with the area for via filling.

25. The computer program product, as recited in claim 23, wherein the at least one spacing rule includes a neighbor spacing rule defining a minimum spacing between vias according to a number of neighboring vias of a type.

26. The computer program product, as recited in claim 23, the set of instructions further configured to:
define the area for via filling as corresponding to an overlap of a design geometry on a first conductive layer with a design geometry on a second conductive layer.

27. The computer program product, as recited in claim 23, the set of instructions further configured to:
reserve within the bounding box a metal enclosure area into which vias are not filled.

28. The computer program product, as recited in claim 23, the set of instructions further configured to:
remove any vias filled outside of the area to be filled; and
resize any vias crossing a boundary of the area to be filled to a smaller type via.

29. The computer program product, as recited in claim 23, the set of instructions further configured to:
set another origin in another corner of the bounding box;
fill the bounding box according to the at least one spacing rule, starting from the another origin, with one or more vias;
compare area and rule check results of the fillings and choose one of the via fills.

30. The computer program product, as recited in claim 23, wherein the computer program is embodied as one or more media selected from a set of a disk, tape, or other magnetic, optical, semiconductor or electronic storage medium and a network, wire line, wireless or other communications medium.

31. An apparatus comprising:
means for setting an origin at one corner of a bounding box associated with an area for via filling; and
means for filling the bounding box according to at least one spacing rule, starting from the origin, with a plurality of vias.

32. The apparatus, as recited in claim 31, further comprising:
means for defining the bounding box to be at least co-extensive with the area for via filling.

33. The apparatus, as recited in claim 31, wherein the means for filling comprises:
means for placing as many of a first type of via as will fit in the bounding box in accordance with the at least one spacing rule, and for repeating the placing for additional types of vias, until all types of vias have been attempted or the bounding box is full.

34. The apparatus, as recited in claim 31, wherein the at least one spacing rule includes a neighbor spacing rule defining a minimum spacing between vias according to a number of neighboring vias of a type.

35. The apparatus, as recited in claim 31, wherein the at least one spacing rule includes a via spacing rule defining a minimum spacing between vias according to a type of neighboring via.

36. The apparatus, as recited in claim 31, wherein the at least one sparing rule includes an enclosure rule that provides for a perimeter region into which no vias are filled.

37. The apparatus, as recited in claim 31, further comprising:
means for defining an area for via filling to correspond to an overlap of a design geometry on a first conductive layer and a design geometry on a second conductive layer.

38. The apparatus, as recited in claim 31, wherein the apparatus further comprises:
means for removing any vias filled outside of a polygon area to be filled; and
means for removing any vias crossing an edge of the polygon area to be filled.

39. The apparatus, as recited in claim 31, further comprising:
means for setting another origin in another corner of the bounding box;
means for filling the bounding box according to the at least one spacing rule, starting from the another origin, with one or more vias;
means for comparing total via area and rule check results of the fillings and choosing one of the via fillings.

* * * * *

UNITED STATES PATENT AND TRADEMARK OFFICE
CERTIFICATE OF CORRECTION

PATENT NO. : 7,007,258 B2 Page 1 of 1
APPLICATION NO. : 10/461041
DATED : February 28, 2006
INVENTOR(S) : Mu-Jing Li It is certified that error appears in the above-identified patent and that said Letters Patent is hereby corrected as shown below:

<u>Column 16</u>
Line 15, the word "sparing" should read -- spacing --.

Signed and Sealed this

Twenty-fifth Day of July, 2006

JON W. DUDAS
*Director of the United States Patent and Trademark Office*